United States Patent [19]

Liu et al.

[11] Patent Number: 5,066,636
[45] Date of Patent: Nov. 19, 1991

[54] CITRATE/ETHYLENEDIAMINE GEL METHOD FOR FORMING HIGH TEMPERATURE SUPERCONDUCTORS

[75] Inventors: Ru-Shi Liu, Hsinchu; Wang-Nang Wang, Taoyuan; Chan-Ting Chang, Hsinchu, all of Taiwan

[73] Assignee: Industrial Technology Research Institute, Taiwan

[21] Appl. No.: 567,940

[22] Filed: Aug. 15, 1990

[51] Int. Cl.$^5$ .......................... H01L 39/12; H01B 1/08
[52] U.S. Cl. ........................................ 505/1; 505/735; 505/737; 252/518; 252/521
[58] Field of Search ............................ 505/1, 735, 737; 252/518, 521

[56] References Cited

PUBLICATIONS

Liu et al., "Application of Gel Technology in Preparation of High-Tc Perovskite Superconductors", *Mat. Res. Soc. Symp. Proc.* vol. 99, Apr. 1988.
Wang et al., "Comparison of Carbonate, Citrate, and Oxalate Chemical Routes to the High-Tc ...," *Inorg. Chem.* vol. 26, 1474-1476 (1987).
Mahloojchi et al., "Production and Sintering of Oxide Superconductor via the Citrate Gel Process," *Brit. Cer. Proc.* vol. 40, 1-14 (1988).

*Primary Examiner*—A. Lionel Clingman
*Assistant Examiner*—Bradley A. Swope
*Attorney, Agent, or Firm*—Scully, Scott, Murphy & Presser

[57] ABSTRACT

A citrate/ethylenediamine gel method for forming oxide superconductors of the Y-Ba-Cu-O, Bi-Ca-Sr-Cu-O, Tl-Ca-Ba-Cu-O system by employing the nitrates of the individual metals and citric acid. Ethylenediamine is then added to form gels. These materials then undergo calcination and sintering processes. The respective superconductors obtained possess a superconducting zero resistance temperature at 93K, 78K and 118K respectively.

2 Claims, 5 Drawing Sheets

FIG_1

FIG_2

FIG_3

CITRATE/ETHYLENEDIAMINE GEL METHOD FOR FORMING HIGH TEMPERATURE SUPERCONDUCTORS

BACKGROUND OF THE INVENTION

The present invention relates to a process for forming high temperature oxide superconductors of Y-Ba-Cu-O, Bi-Ca-Sr-Cu-O, Tl-Ca-Ba-Cu-O types.

In conventional processes, high temperature oxide superconductors are prepared by conventional solid state reaction. That is, the metal oxides or/and carbonates desired in the final formula of oxide superconductor are mixed in an appropriate ratio, ground, calcined, and sintered to obtain oxide superconducting materials. The final product obtained in this process gives coarse particulate and poor uniformity in sizes which seriously affects its superconducting property and subsequent application.

The drawbacks of the above process can be improved by employing a method of co-precipitation in which more uniform and finer particulates of superconductive oxide materials can be obtained. However, in this process, the stoichiometry of the coprecipitates is rather difficult to be controlled owing to the different solubility between various ions, and therefore, this process is inappropriate to be used in mass production.

Another method for the production of oxide superconductor is by employing a citrate gel as a precursor. The precursor is calcined and sintered to form a powdery form of superconductive oxide materials. In this method, the ratios of the individual metal components can be easily controlled as compared to the coprecipitation method, and thus this method can suitably be used in mass production of superconductive oxide materials. However, there are still drawbacks in this method. For instance, the citrate gel of an alkaline earth cannot be easily formed in acid solution and the interaction within them is poor.

SUMMARY OF THE INVENTION

Therefore, it is an objective of the present invention to provide a method for the synthesis of oxide superconductors of Y-Ba-Cu-O, Bi-Ca-Sr-Cu-O, and Tl-Ca-Ba-Cu-O types, which can improve the drawbacks of the above conventional method.

It is another objective of the present invention to provide a method for the synthesis of oxide superconductors of Y-Ba-Cu-O, Bi-Ca-Sr-Cu-O, and Tl-Ca-Ba-Cu-O types, wherein the ratio of the individual metal components can be easily controlled.

It is yet another objective of the present invention to provide a method for the synthesis of oxide superconductors of Y-Ba-Cu-O, Bi-Ca-Sr-Cu-O, and Tl-Ca-Ba-Cu-O types, wherein the superconducting zero resistance temperatures are 93 K, 78 K, and 118 K respectively.

It is still another objective of the present invention to provide a method for the forming of metal oxide superconductors of Y-Ba-Cu-O, Bi-Ca-Sr-Cu-O, and Tl-Ca-Ba-Cu-O types, wherein the superconductive material is very fine and uniform in particle size.

These and other objectives, advantages and features of the present invention will be more fully understood and appreciated by reference to the written specification and the appended drawings.

DETAILED DESCRIPTION OF THE INVENTION

Figure 1:
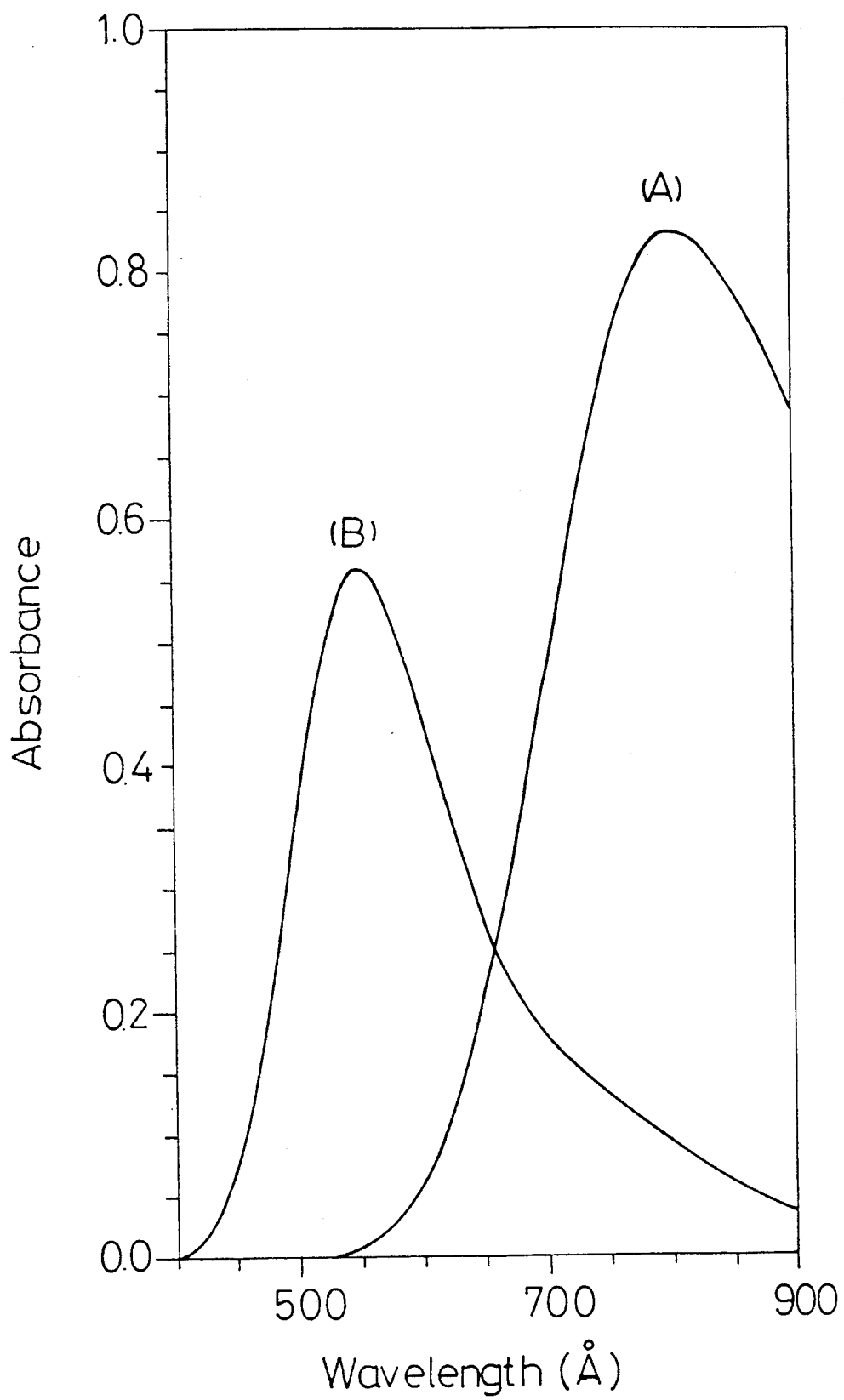
FIG. 1 shows the absorption spectra of Bi-Ca-Sr-Cu-O before(A) and after(B) the addition of ethylenediamine.

The present invention relates to a process of forming oxide superconductors of Y-Ba-Cu-O, Bi-Ca-Sr-Cu-O, and Tl-Ca-Ba-Cu-O types, which comprises:

(a) the individual nitrate salts of the metal desired in the final superconductor composition in an appropriate ratio to form an aqueous solution, wherein the total metal concentration is 0.5 M. (Bismuth nitrate was dissolved in dilute nitric acid with heating).

(b) adding one gram equivalent of citric acid for each gram equivalent of metals into the solution obtained in (a);

(c) adjusting the pH value of the solution to 6 by adding ethylenediamine;

(d) heating the solution to 80°–100° C. and holding for 1 to 2 hours in order to let the water content gradually evaporate until a deep blue gel is obtained;

(e) decomposing the gel at 500° C. for 2 hours until a black powder having an average size of about 0.3 um is formed;

(f) calcining the decomposed powders at a temperature range of 800° C. to 900° C. for about 10 hours;

(g) grinding the calcined powders and compressing the mixture at a pressure of 2 tons/cm$^2$ to form a pellet of 10 mm×2 mm$^t$;

(h) sintering the above pellets at a temperature range of 800 ° C. to 1000° C.; to form an oxide superconducting material; and (i) grinding the pellet in (h) to form a powdery metal oxide superconductive material.

EXAMPLE 1

In the case of Y-Ba-Cu-O, the use of metal nitrate salts were Y(NO$_3$)$_3$.5H$_2$O:Ba(NO$_3$)$_2$:Cu(NO$_3$)$_2$.3H$_2$O=1 (1.200 g):2 (1.718 g):3 (2.383 g) in molar ratio. They were dissolved in de-ionized water as described in (a). An amount of 5.876 g citric acid was added into the aqueous solution as described in (b). Following procedures were described as (c), (d) and (e). The calcination condition for Y-Ba-Cu-O was 850°–950° C. for 10 hours in air. The sintering condition for Y-Ba-Cu-O was 900°–950° C. for 12 hours in flowing oxygen.

EXAMPLE 2

In the case of Bi-Sr-Ca-Cu-O, the use of metal nitrate salts were Bi(NO$_3$)$_3$.5H$_2$O:Ca(NO$_3$)$_2$:Sr(NO$_3$)$_2$:Cu(NO$_3$)$_2$.3H$_2$O=2 (1.00 g):1 (0.536 g):2 (0.48 g):2 (1.096 g) in molar ratio. They were dissolved in de-ionized water as described in (a). An amount of 3.332 g citric acid was added into the aqueous solution as described in (b). Following procedures were described as (c), (d) and (e). The calcination condition for Bi-Sr-Ca-Cu-O was 780°–830° C. for 10 hours in air. The sintering condition for Bi-Sr-Ca-Cu-O was 840°–880° C. for 12–24 hours in air or flowing oxygen and followed by furnace cooling.

EXAMPLE 3

In the case of Tl-Ca-Ba-Cu-O, the use of metal nitrate salts were $Ca(NO_3)_2 \cdot 4H_2O:Ba(NO_3)_2:Cu(NO_3)_2 \cdot 3H_2O = 3$ (1.594 g):1 (0.588 g):3 (1.631 g) in molar ratio. They were dissolved in deionized water as described in (a). An amount of 4.961 g citric acid was added into the aqueous solution as described in (b). Following procedure are described as (c), (d) and (e). The calcination condition was 900°–920° C. for 10–20 hours in air. $Tl_2O_3$ (0.4892 g) was then mixed into the obtained calcined powder (1.200 g) to form the mixture with a molar ratio of Tl:Ca:Ba:Cu=1:3:1:3. The pellet obtained in procedure (g) was sealed in a Au box to alleviate the evaporation of thallium component during the sintering period. The sintering condition of Tl-Ca-Ba-Cu-O was 880–920° C. for 5–15 min in flowing oxygen and was followed by furnace cooling.

FIG. 1 shows the visible spectra of the metal-citrate complex for the Bi-Ca-Sr-Cu-O system. Significant hyposochromic shifts in the maximum absorption ($_{max}$) were observed after the addition of ethylenediamine for all citrate solutions as below:

|  | Citrate complex | Ethylenediamine added |
|---|---|---|
| Y—Ba—Cu—O | 803.4 nm | 647.2 nm |
| Bi—Ca—Sr—Cu—O | 807.8 nm | 549.2 nm |
| Tl—Ca—BA—Cu—O | 801.2 nm | 714.2 nm |

This blue shift is closely related with the strengthening of the metal-ligand interaction. There are certain advantages to using ethylenediamine instead of ammonia water to adjust the pH. Firstly, the interaction between alkaline earth metal ions and citrate ions was fairly weak under the acidic condition. Ethylenediamine can readily react with nitric acid to form ethylenediamine dinitrate and hence prevent the precipitation of the crystalline alkaline earth metal nitrates. Secondary, ethylenediamine also acts as a cross linking agent to bind citrate anion through Coulombic interactions. Thirdly, ethylenediamine itself is also a strong bidentate chelating agent for metal ions.

Figure 2:
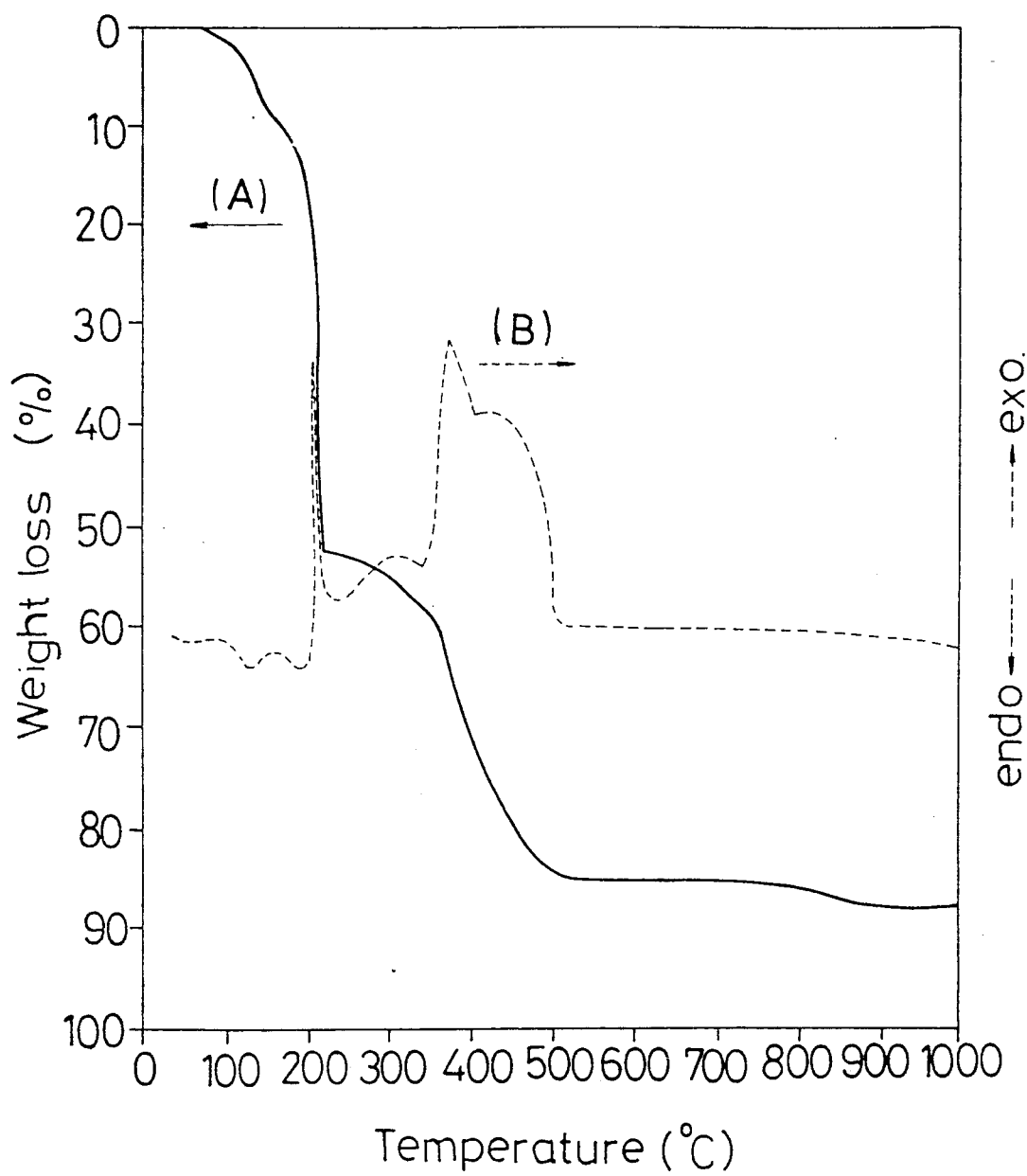
FIG. 2 shows the results of thermogravimetric analysis (A) and differential thermal analysis (B) for Y-Ba-Cu citrate/ethylenediamine mixed precursor.
Figure 3:
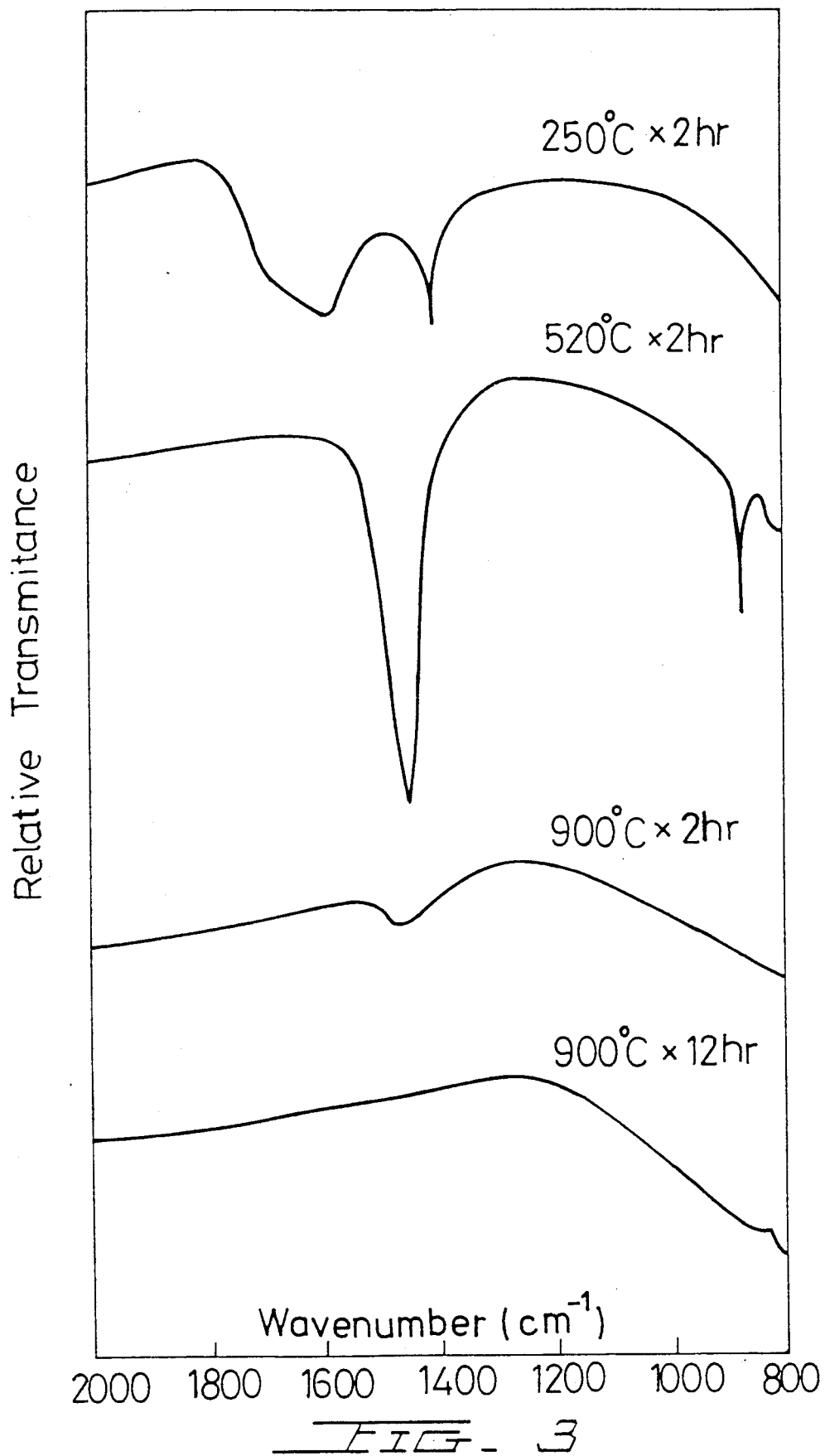
FIG. 3 shows the IR transmittance spectra of mixed precursor of Y-Ba-Cu citrate/ethylenediamine after being calcined.

The citrate precursors were found to undergo stepwise thermal decomposition. FIG. 2 shows the typical DTA and TGA curves of the precursor for Y-Ba-Cu-O. The behavior was essentially the same for the Bi-Ca-Sr-Cu-O and Ca-Ba-Cu-O precursors prepared in this study. The loss of water and the decomposition of free citric acid occurred between 100°–150° C.; the break of ethylenediamine and citrate complex, and the decomposition of nitrates occurred between 300°–450° C. The final weight loss at about 500°–800° C. was related with the elimination of residual carbonates and nitrates. The IR spectra of the Y-Ba-Cu-O precursor and its calcination product (FIG. 3) also confirmed this decomposition behavior. The metal carboxylates (C=O at 1640 cm$^{-1}$ and C—O asymmetric stretching at 1580 cm$^{-1}$) and nitrates (N—O at 1380 cm$^{-1}$) were converted to carbonates (C—O for $CO_3^{-2}$ at 1410 and 850 cm$^{-1}$) after the calcination at 520° C. for 2 h. The complete decomposition of carbonates and the formation of superconducting phases can be achieved by sintering the sample at 900° C. for 12 h.

Figure 4:
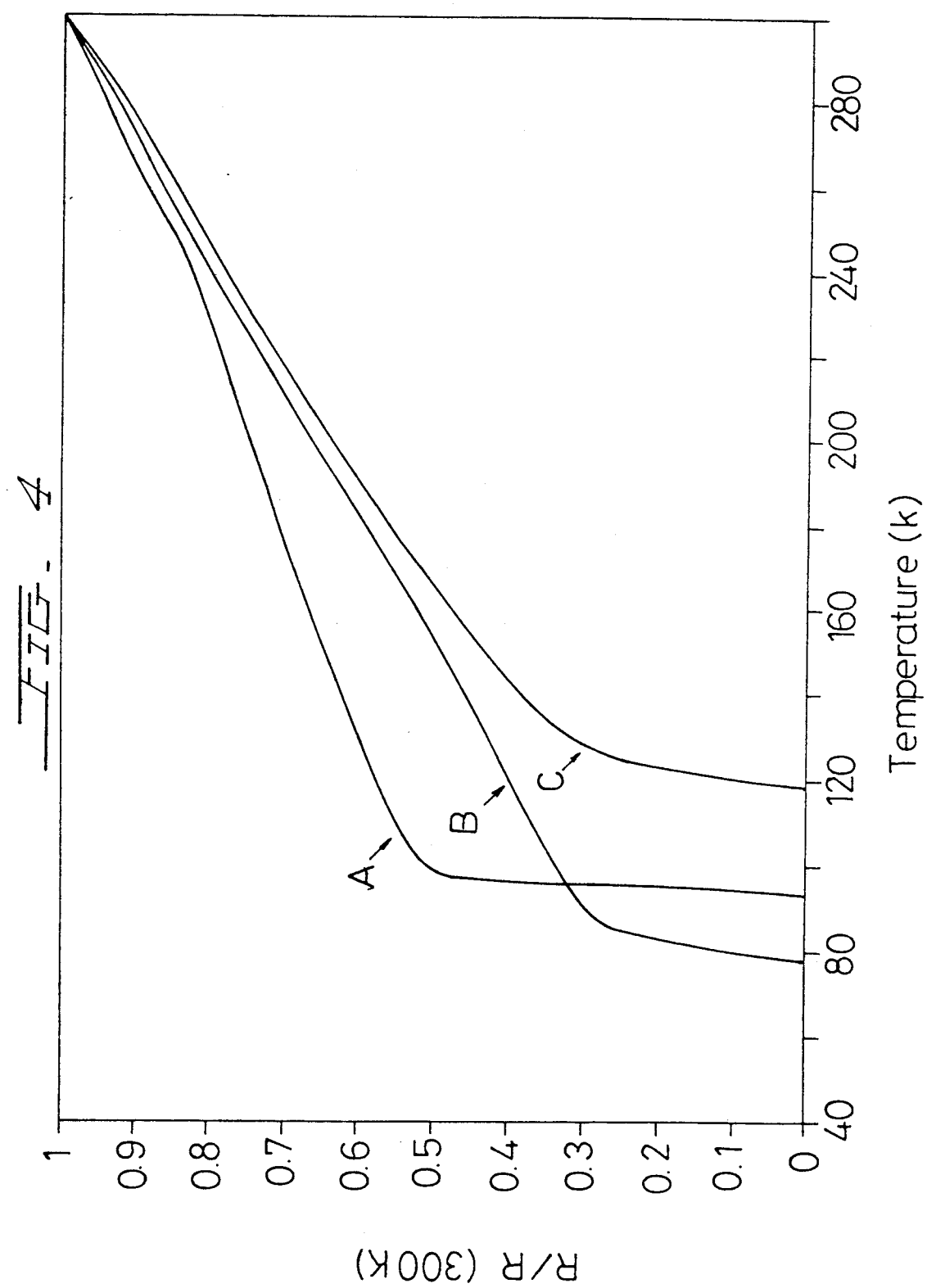
FIG. 4 illustrates the temperature dependence of the normalized resistance of Y-Ba-Cu-O (A), Bi-Ca-Sr-Cu-O (B), and Tl-Ca-Ba-Cu-O (C) in accordance with the present invention.
Figure 5:
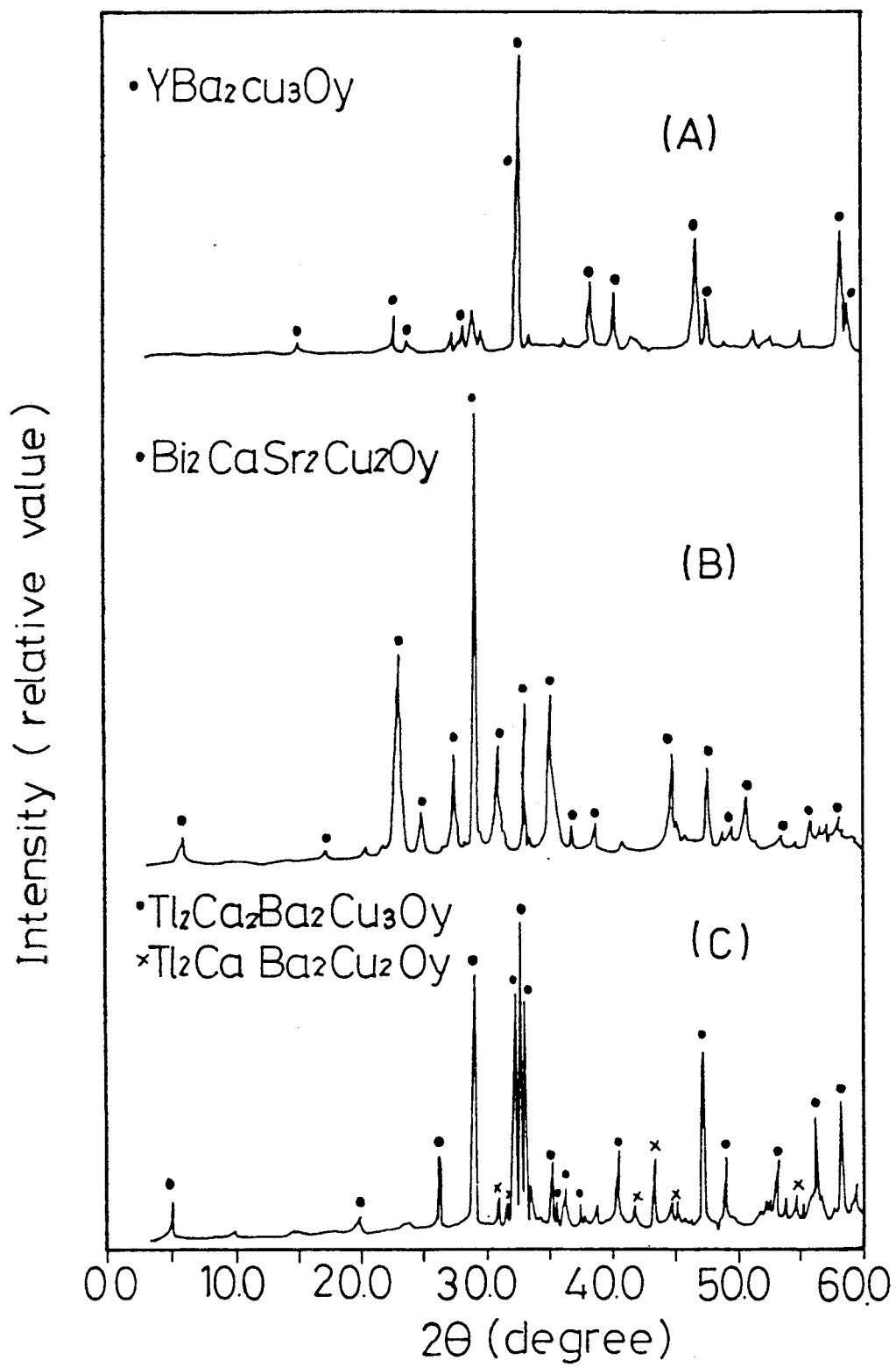
FIG. 5 illustrates the X-ray diffraction patterns of Y-Ba-Cu-O (A), Bi-Ca-Sr-Cu-O (B), and Tl-Ca-Ba-Cu-O (C) in accordance with the present invention.

The temperature dependences of the normalized resistance for Y-Ba-Cu-O (Tc$_{(zero)}$=93 K), Bi-Ca-Sr-Cu-O (Tc$_{(zero)}$=78 K), and Tl-Ca-Ba-Cu-O (Tc$_{(zero)}$=118 K) samples are shown in FIG. 4. The scanning electron micrograph shows the uniformly monodispersed Bi-Ca-Sr-Cu-O precursor powders (calcined at 520° C. for 2 h) with a particle size of less than 0.3 um. Energy dispersive spectrometry (EDS) and inductively coupled plasma atomic emission spectrometry (ICP-AES) results indicate that both Y-Ba-Cu-O and Bi-Ca-Sr-Cu-O precursors exhibited better homogeneity and stoichiometry compared with those prepared by coprecipitation. A deficiency of bismuth and alkaline earth metals was observed in samples prepared by the latter method. X-ray diffraction patterns for Bi-Ca-Sr-Cu-O samples calcined at 600°, 700°, and 800° C. for 12 h show a gradual increase of the $Bi_2CaSr_2Cu_2O_8$ phase. The density and Tc$_{(zero)}$ were (6.21 g/cm$^3$, <15 K), (6.28 g/cm$^3$, 15 K), and (6.32 g/cm$^3$, 40 K) for samples calcined at 600°, 700°, and 800° C. respectively. X-ray diffraction patterns for Y-Ba-Cu-O(A), Bi-Ca-Sr-Cu-O(B) and Tl-Ca-Ba-Cu-O(C) are shown in FIG. 5. From the figure, the superconducting phase of Y-Ba-Cu-O is $YBa_2Cu_3O_7$; that of Bi-Ca-Sr-Cu-O is $Bi_2CaSr_2Cu_2O_8$ and that of Tl-Ca-Ba-Cu-O is essentially $Tl_2Ca_2Ba_2Cu_3O_{10}$ with a trace of $Tl_2CaBa_2Cu_2O_8$ phase.

In conclusion, ultrafine and homogeneous powders of Y-Ba-Cu-O, Bi-Ca-Sr-Cu-O, and Tl-Ca-Ba-Cu-O superconducting materials were successfully prepared by a citrate/ethylenediamine gel route. The viscous gel appeared to be useful for a number of applications such as the preparation of thick films, tape wire, and targets for sputtering.

It is understood the above is merely a preferred embodiment of the invention and that various changes and alternations can be made without departing from the spirit and broader aspects as set forth in the appended claims.

We claim:

1. A citrate/ethylenediamine gel method for producing homogeneous superconducting oxide powders comprising:
   (a) dissolving nitrates of constituent metals in water in desired proportions;
   (b) adding an aqueous solution of citric acid into the aqueous of mixture of (a) at one gram equivalent of citric acid for each gram equivalent of metals until the total concentration of the metal ions is about 0.5 M;
   (c) adding ethylenediamine dropwise into the solution with constant stirring until the pH is 6;
   (d) heating the above solution to 80°–100° C. and holding for 1–2 hours to let gradually evaporate the water content until a deep blue gel is obtained;
   (e) decomposing the gel at 500° C. for 2 hours until black solid particles having an average size of about 0.3 um formed are;
   (f) calcining the decomposed particles at a temperature of 800° C. to 900° C. for about 10 hours;
   (g) grinding the calcined particles and compressing the mixture to form a pellet;
   (h) sintering the above pellet at a temperature range of about 800° C. to 1000° C.; and
   (i) grinding the pellet in (h) to form a powdery metal oxide superconductive material.

2. A citrate/ethylenediamine gel method as claimed in claim 1 in which the superconducting oxides powders are Y-ba-Cu-O, Bi-Ca-Sr-Cu-O and Tl-Ca-Ba-Cu-O.

* * * * *

UNITED STATES PATENT AND TRADEMARK OFFICE
CERTIFICATE OF CORRECTION

PATENT NO. : 5,066,636
DATED : November 19, 1991
INVENTOR(S) : Ru-Shi Liu, et al.

It is certified that error appears in the above-identified patent and that said Letters Patent is hereby corrected as shown below:

Column 4, line 46, Claim 1: delete first occurrence of "of"

Column 4, line 57, Claim 1: "formed are" should read as --are formed--

Column 4, line 67, Claim 2: "ba" should read as --Ba--

Signed and Sealed this

Twenty-second Day of June, 1993

Attest:

MICHAEL K. KIRK

Attesting Officer     Acting Commissioner of Patents and Trademarks